(12) United States Patent
Dennard et al.

(10) Patent No.: US 7,417,288 B2
(45) Date of Patent: Aug. 26, 2008

(54) SUBSTRATE SOLUTION FOR BACK GATE CONTROLLED SRAM WITH COEXISTING LOGIC DEVICES

(75) Inventors: Robert H. Dennard, New Rochelle, NY (US); Wilfried E. Haensch, Somers, NY (US); Arvind Kumar, New York, NY (US); Robert J. Miller, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 11/311,462

(22) Filed: Dec. 19, 2005

(65) Prior Publication Data

US 2007/0138533 A1    Jun. 21, 2007

(51) Int. Cl.
*H01L 29/76* (2006.01)
(52) U.S. Cl. ............... 257/365; 257/347; 257/366; 257/E27.098; 365/182
(58) Field of Classification Search .......... 257/365–366
See application file for complete search history.

(56) References Cited

U.S. PATENT DOCUMENTS

| | | | |
|---|---|---|---|
| 5,068,756 A * | 11/1991 | Morris et al. | 257/192 |
| 5,706,226 A | 1/1998 | Chan et al. | |
| 5,892,260 A | 4/1999 | Okumura et al. | |
| 5,982,004 A | 11/1999 | Sin et al. | |
| 5,986,924 A | 11/1999 | Yamada | |
| 6,004,837 A * | 12/1999 | Gambino et al. | 438/157 |
| 6,166,412 A * | 12/2000 | Kim et al. | 257/366 |
| 6,504,173 B2 * | 1/2003 | Hsu et al. | 257/60 |
| 6,534,819 B2 | 3/2003 | Tiwari et al. | |
| 6,538,916 B2 * | 3/2003 | Ohsawa | 365/149 |
| 6,646,307 B1 * | 11/2003 | Yu et al. | 257/347 |
| 6,940,129 B2 * | 9/2005 | Kim et al. | 257/347 |
| 2002/0160581 A1 | 10/2002 | Watanabe et al. | |
| 2004/0143769 A1 | 7/2004 | Deng et al. | |
| 2004/0259295 A1 | 12/2004 | Kanna et al. | |
| 2005/0145850 A1 | 7/2005 | Dennison et al. | |

OTHER PUBLICATIONS

Tsuchiya R. et al., "Silicon on Thin Box: a New Paradigm of the CMOSFET for Low-Power and High-Performance Application Featuring Wide-Range Back-Bias Control" IEEE, 2004, pp. 27.2.1-27.2.4.

* cited by examiner

*Primary Examiner*—Jerome Jackson
*Assistant Examiner*—Jose R Diaz
(74) *Attorney, Agent, or Firm*—Scully, Scott, Murphy & Presser, P.C.; Ido Tuchman, Esq.

(57) ABSTRACT

A semiconductor structure that includes at least one logic device region and at least one static random access memory (SRAM) device region wherein each device region includes a double gated field effect transistor (FET) wherein the back gate of each of the FET devices is doped to a specific level so as to improve the performance of the FET devices within the different device regions is provided. In particular, the back gate within the SRAM device region is more heavily doped than the back gate within the logic device region. In order to control short channel effects, the FET device within the logic device region includes a doped channel, while the FET device within the SRAM device region does not. A none uniform lateral doping profile with a low net doping beneath the source/drain regions and a high net doping underneath the channel would provide additional SCE control for the logic device.

1 Claim, 3 Drawing Sheets

SUBSTRATE SOLUTION FOR BACK GATE CONTROLLED SRAM WITH COEXISTING LOGIC DEVICES

FIELD OF THE INVENTION

The present invention relates to a semiconductor structure and more particularly to a semiconductor structure that includes at least one logic device region and at least one static random access memory (SRAM) device region wherein each device region includes a double gated field effect transistor (FET) and wherein the back gate of each of the FET devices is doped to a specific level so as to improve the performance of the FET devices within the different device regions. In particular, the back gate within the SRAM device region is more heavily doped than the back gate within the logic device region. In order to control short channel effects, the FET device within the logic device region includes a doped channel, while the FET device within the SRAM device region does not.

BACKGROUND OF THE INVENTION

A major problem with static random access memory (SRAM) scaling is the role of doping fluctuations. It is expected that for the 45 nm node doping fluctuations will be one of the single most important inhibitors for further scaling.

Projecting the threshold mismatch from the current available data, a one sigma mismatch of 80 mV is expected. This would result in an array of fail rates that is beyond a practical repair rate.

Doping fluctuation scaling is related to the absolute number, N, of doping atoms in the channel and their distribution, where N is proportional to the device area. The doping fluctuation will scale approximately to the equation $1/\sqrt{W*L}$, where W and L are the device width and device length, respectively. Furthermore, the threshold variation is scaled by the square root of the second moment of the doping distribution perpendicular to the gate interface, which is related to the total number of dopants N in the channel. Shrinking feature sizes will require higher doping levels and because SRAM devices have one of smallest device areas known in the semiconductor art, doping fluctuation will tend to impair this region first.

SUMMARY OF THE INVENTION

The present invention provides a substrate solution for back gate controlled SRAMs with coexisting logic devices that addresses the doping fluctuation problem mentioned above. More particularly, the present invention provides a semiconductor structure that includes at least one logic device region and at least one static random access memory (SRAM) device region wherein each device region includes a double gated field effect transistor (FET) and wherein the back gate of each of the FET devices is doped to a specific level (i.e., dopant concentration) so as to improve the performance of the FET devices within the different device regions. In accordance with the present invention, the back gate within the SRAM device region is more heavily doped than the back gate within the logic device region. In order to control short channel effects, the FET device within the logic device region includes a doped channel, while the FET device within the SRAM device region does not.

In one embodiment of the present invention, each region includes a double gate device that is used in conjugation with an ultra-thin (on the order of about 10 nm to about 20 nm) body planar fully depleted semiconductor-on-insulator (SOI) material. The back gate will be unpatterned across the ultra-thin body planar fully depleted SOI material. For the body thickness, $T_{Si}$ an optimal value is selected to prevent hole accumulation (thick side) and a manufacturable window for the logic device (thin side). The back gate thickness $T_{Bg}$ is selected by what amount of voltage $V_{Bg}$ can be provided on the chip. An optimal range for $T_{Si}$ is from about 10 nm to about 20 nm, with 10 nm being highly preferred, and an optimal range for $T_{Bg}$ is from about 10 nm to about 20 nm, with 10 nm also being highly preferred.

To maximize back gate control in the SRAM regions (i.e., the regions including an undoped channel), heavily doped back gate electrodes with p+ doping and n+ doping, for nFETs and pFETs, respectively, are provided in these regions, relative to the doping concentration in the logic device areas (i.e., devices including a doped channel). Highly doped back gates will degrade logic device performance due to capacitive coupling of the drain to the back gate. To minimize this additional capacitance, the back gates in the logic regions are only lightly doped and are biased with a voltage, which keeps portions under the drain largely depleted. With appropriate optimization of the deep source drain implants, reduced net doping in the back gate region beneath the source/drain is achieved, henceforth increased depletion layer, can also be achieved to minimize junction capacitance. This option would be self-aligned to the front gate. In accordance with the present invention, the back gate is not utilized in the logic regions for threshold control. Short channel control (SCE) can be achieved in the present invention however by employing a conventional halo implant in the logic regions. In the SRAM regions, halo doping is not needed, since the threshold voltage is set by appropriate back gate biasing. This adjustment can be fine tuned for the particular chip to compensate for other systemic variations like gate length or body thickness.

In the embodiment described above, the back gate is isolated from the semiconductor substrate by a dielectric layer, e.g., the buried isolating layer of an SOI substrate. This particular structure permits unrestricted use of the back gate bias during operation since the back gates are isolated from the semiconductor substrate and from each other.

In another embodiment of the present invention, the back gates are essentially deep well implants that are formed within a bulk semiconductor substrate. In the case of a p-type substrate, the n+ back gate is separated by a pn junction from the substrate and the p+ back gate. In the case of an n-type substrate, the p+ back gate is separated by a pn junction from the substrate and the n+ back gate. In both cases, the back gate biases will be limited so that the voltage across the pn junction keeps the bias in reverse mode. The level of doping in the back gate can also be used to adjust the front gate threshold in moderate amounts. The trade off with this structure is to balance the impact of additional junction capacitance for the logic gates at the highest back gate doping levels.

In general terms, the present invention provides a semiconductor structure which includes:

a substrate including at least one logic device region and at least one SRAM device region, said device regions are separated by an isolation region;

at least one double gated logic device within said at least one logic device region, wherein said at least one double gated logic device includes, from bottom to top, a back gate, a back gate dielectric, a body region, a front gate dielectric and a front gate, said body region of said logic device includes a doped channel; and at least one double gated SRAM device within said least one SRAM device region, wherein said at least one double gated SRAM device includes, from bottom to top, a back gate, a back gate dielectric, a body region, a front gate dielectric and a front gate, said body region of said SRAM device includes a non-doped channel, and said back gate of said SRAM device has a higher doping level that said back gate of said logic device.

In accordance with one embodiment of the present invention, the back gates and the front gates within the logic and SRAM device regions may have the same conductivity. Alternatively, and in a preferred embodiment, the back gate and its corresponding front gate within each of the device regions have an opposite conductivity. In one embodiment of the present invention, the front gates within both device regions are n-type, and the back gates within each device regions are p-type, with the back gate within the SRAM device region having a higher p-type doping level than the back gate within the logic device region. In another embodiment, the front gates within both device regions are p-type, and the back gates within each device regions are n-type, with the back gate within the SRAM device region having a higher n-type doping level than the back gate within the logic device region. In yet another embodiment of the present invention, both device regions include at least one n-type front gate and at least one p-type front gate. In this embodiment, the back gates of the n-type front gates have a p-type conductivity and the concentration of p-type doping within the SRAM device back gate is greater than that of the logic device back gate. Likewise, the back gates of the p-type front gates have an n-type conductivity and the concentration of n-type doping within the SRAM device back gate is greater than that of the logic device back gate.

SOI and bulk semiconductor substrates are both contemplated in the present invention and can be utilized.

In the case of an SOI substrate, the inventive semiconductor structure includes:

at least one double gated logic device within at least one logic device region, wherein said at least one double gated logic device includes, from bottom to top, a back gate, a back gate dielectric, a body region, a front gate dielectric and a front gate, said body region of said logic device includes a doped channel;

at least one double gated SRAM device within least one SRAM device region, wherein said at least one double gated SRAM device includes, from bottom to top, a back gate, a back gate dielectric, a body region, a front gate dielectric and a front gate, said body region of the SRAM device includes a non-doped channel and said back gate of said SRAM device has a higher doping level that said back gate of said logic device; and at least a buried insulating layer located beneath each of said back gates.

For the bulk embodiment, the inventive semiconductor structure includes:

at least one double gated logic device within at least one logic device region, wherein said at least one double gated logic device includes, from bottom to top, a back gate, a back gate dielectric, a body region, a front gate dielectric and a front gate, said body region of said logic device includes a doped channel;

at least one double gated SRAM device within least one SRAM device region, wherein said at least one double gated SRAM device includes, from bottom to top, a back gate, a back gate dielectric, a body region, a front gate dielectric and a front gate, said body region of said SRAM device includes a non-doped channel and said back gate of said SRAM device has a higher doping level that said back gate of said logic device; and a semiconductor substrate located beneath each of said back gates.

DETAILED DISCUSSION OF THE INVENTION

Figure 1:
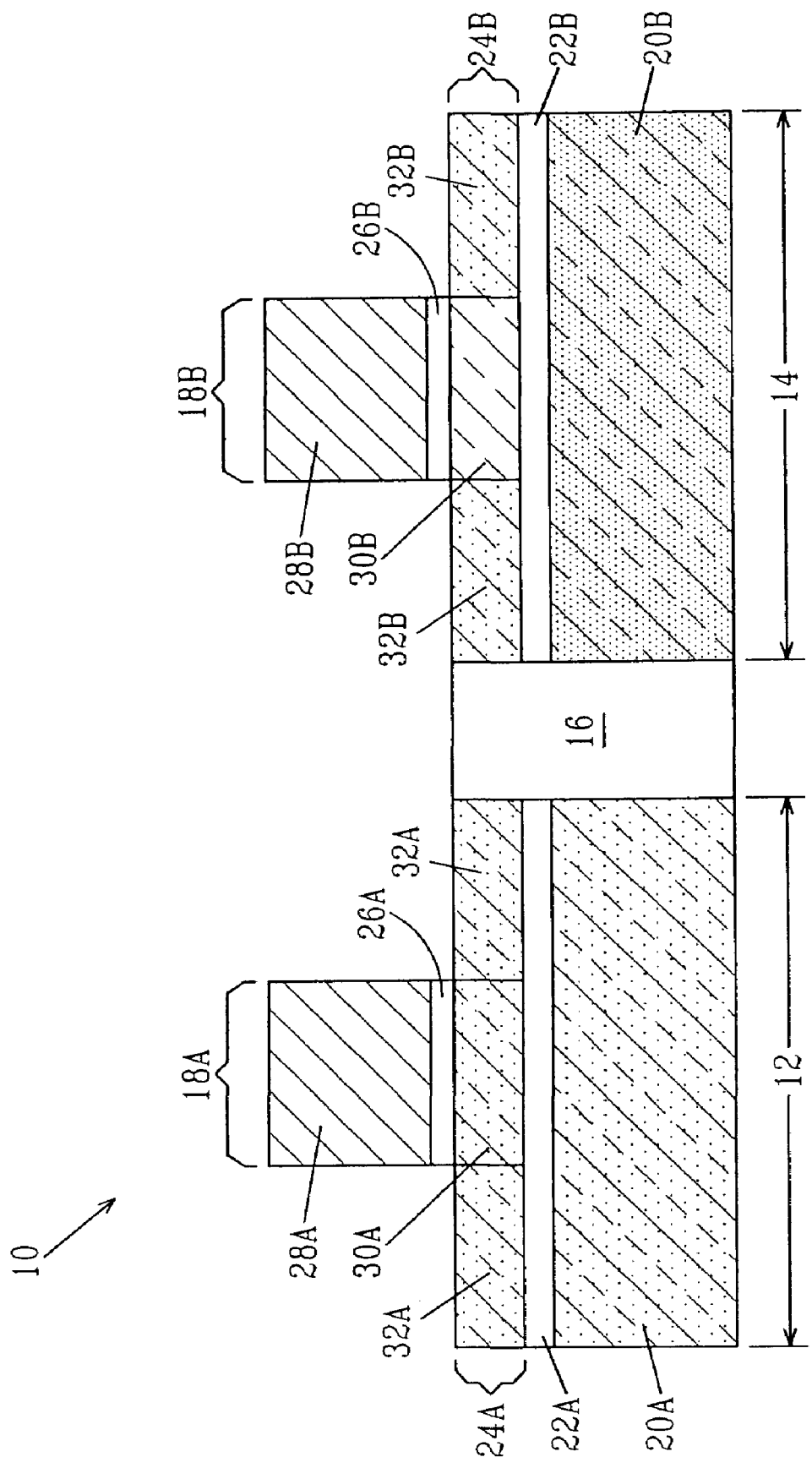
FIG. 1 is pictorial representation (through a cross sectional view) depicting the basic semiconductor structure of the present application.

The present invention, with provides a substrate solution for back gate controlled SRAM devices with coexisting logic devices, will now be described in greater detail by referring to the following discussion and drawings that accompany the present application. It is noted that the drawings are provided for illustrative purposes and, as such, they are not drawn to scale. Moreover, in the drawings like and corresponding elements are referred to by like reference numerals.

FIG. 1 is an enlarged cross sectional view depicting the semiconductor structure 10 of the present invention. Specifically, the semiconductor structure 10 shown in FIG. 1 comprises a logic device region 12 and a SRAM device region 14. Theses two different device regions are separated by an isolation region 16. The structure 10 also includes at least one double gated logic device 18A within the at least one logic device region 12. In accordance with the present invention, the at least one double gated logic device 18A includes, from bottom to top, a back gate 20A, a back gate dielectric 22A, a body region 24A, a front gate dielectric 26A and a front gate 28A. The back gate 20A of the logic device 18A is of a same conductivity type as the front gate 18A or, preferably, an opposite conductivity type than the front gate 28A of the logic device 18A and the body region 24A of the logic device 18A includes a doped channel 30A. The doped channel 30A is located beneath the front gate 28A and is laterally confined by source/drain regions 32A. In accordance with the present invention, the doped channel 30A comprises a halo doped channel having the same conductivity type as the back gate 20A, while the source/drain regions 32A have the same conductivity type as the front gate 28A.

The structure 10 shown in FIG. 1 also includes at least one double gated SRAM device 18B within the least one SRAM device region 14. In accordance with the present invention, the at least one double gated SRAM device 18B includes, from bottom to top, a back gate 20B, a back gate dielectric 22B, a body region 24B, a front gate dielectric 26B and a front gate 28B. In the present invention, the back gate 20B of the SRAM device 18B is designed to have a same or, preferably, an opposite conductivity type from the front gate 28B of the SRAM device 18B and the body region 24B of the SRAM device 18B includes a non-doped channel 30B. The non-doped channel 30B is located beneath the front gate 28B and it is laterally confined by source/drain regions 32B, which are of the same conductivity type as the front gate 28B. In accordance with the present invention, the back gate 20B of the SRAM devices 18B has a higher doping level that the back gate 20A of the logic device 18A.

Although not shown in FIG. 1, the back gates 20A and 20B are located above a substrate. In one embodiment, the substrate is a bulk semiconductor such as, for example, Si, Ge, SiGe, SiC, SiGeC, Ga, GaAs, InAs, InP and all other III/V or II/VI compound semiconductors. In another embodiment, the substrate is a fragment of a semiconductor-on-insulator (SOI) including a bottom semiconductor layer and a buried insulating layer located on the bottom semiconductor layer. The buried insulating layer may be a crystalline or non-crystalline oxide, nitride, or oxynitride, with buried oxides being highly preferred. In embodiments, in which the substrate includes a fragment of an SOI substrate, the back gates 20A and 20B are isolated from the bottom semiconductor layer (i.e., semiconductor substrate) by the buried insulating layer.

The materials used in providing the structure shown in FIG. 1 are well known to those skilled in the art. For example, the back gate 20A and 20B typically, but not always, comprise a semiconductor material or polysilicon that is doped as indicated above. In accordance with the present invention, the doping of the back gate 20A and 20B may occur prior (lateral homogeneous doping of back gate at back gate dielectric/back gate interface) to or after (none homogeneous doping of back gate along the back dielectric/back gate interface, this implant would be self aligned to the front gate and could be done with the deep source drain implant) the front gate has been formed. Doping is achieved by ion implantation and annealing is used to activate the dopants within the doped regions.

In accordance with the present invention, the dopant concentration of the back gate 20B of the SRAM device 18B is higher than that of the back gate 20A of the logic devices 18A. Typically, the dopant level within back gate 20B is about $1\times10^{20}$ atoms/cm$^3$ or greater, with a range from about $10^{19}$ atoms/cm$^3$ to about $10^{20}$ atoms/cm$^3$ atoms/cm$^3$ being even more typical. The dopant level within the back gate 20A is about $10^{18}$ atoms/cm$^3$ or less, with a range from about $10^{16}$ atoms/cm$^3$ to about $10^{18}$ atoms/cm$^3$ atoms/cm$^3$ being even more typical.

The dopant type is n or p, and it is determined by the dopant type of the front gate 28A and 28B within each of the device regions. The present invention contemplates embodiments in which the back gates and the front gates have the same conductivity. The preferred choice is the opposite polarity of front and back gate. Each of the back gates 20A and 20B generally has the same thickness.

The back gate dielectric 22A and 22B in each of the device regions typically comprises the same dielectric material. Suitable dielectrics used for the back gate dielectric 22A and 22B include oxides, nitrides, oxynitrides or multilayers thereof. Specific examples of dielectrics that can be used for the back gate dielectric 22A and 22B include, but are not limited to: $SiO_2$, SiN, SiON, $HfO_2$, $Al_2O_3$, $TiO_2$, $La_2O_3$, $SrTiO_3$, $LaAlO_3$, $Y_2O_3$ or $Gd_2O_3$. The physical thickness of the back gate dielectric, which is formed by a conventional deposition, as a result of a layer transfer, or thermal process, may vary depending on the technique used to form the back gate dielectric as well as the material or materials forming the back gate dielectric. Typically, the back gate dielectric 22A and 22B has a thickness from about 10 nm to about 20 nm.

The body region 24A and 24B within each of the device regions comprises a semiconductor material such as, for example, Si, SiGe, polySi or SiGeC. The body region 24A and 24B is typically provided by a layer transfer process or by deposition. The thickness of the body region 24A and 24B is typically from about 10 nm to about 20 nm.

Each body region 24A and 24B within the device regions 18A and 18B, respectively, includes a channel 30A and 30B and adjoining source/drain regions 32A and 32B. In accordance with the present invention, the channel 30A within the logic device region 12 is doped, while the channel 30B within the SRAM device region 14B is non-doped. Doping of the channel within the logic device region occurs after forming the front gate utilizing a conventional angled ion implantation process. Typically, halo dopants (p or n) are used and the concentration of the halo dopants within the doped channel 30A is from about $10^{17}$ atoms/cm$^3$ to about $10^{19}$ atoms/cm$^3$. The halo doping type is the same as that of the back gate 20A for the preferred implementation. The source/drain regions 32A and 32B are formed after the front gate utilizing a conventional ion implantation process well known in the art. The doping type is the same as that of the front gate 28A and 28B.

The front gate dielectric 26A and 26B within the two different device regions comprises one of the dielectric materials mentioned above with respect to the back gate dielectric 22A and 22B. It is noted the front gate dielectric may comprise the same or different dielectric as that of the back gate dielectric. The above-mentioned processes used in forming the back gate dielectric 22A and 22B can be used in forming the front gate dielectric 26A and 26B as well.

The physical thickness of the front gate dielectric 26A and 26B may vary depending on the technique used to form the front gate dielectric as well as the material or materials forming the front gate dielectric. Typically, the front gate dielectric 26A and 26B has a thickness from about 1 nm to about 3 nm.

The front gate 28A and 28B with each of the device regions comprises any conductive material including, for example, a Si-containing conductor, a metal conductor, a metal alloy conductor, a metal nitride conductor, a metal oxynitride conductor, a metal silicate or multilayers thereof. Typically, the front gate 28A and 28B is a Si-containing conductor, with polySi conductors being highly preferred. The front gate 28A and 28B is formed utilizing conventional processes well known in the art. Note that when a Si-containing conductor is used, an in-situ doping deposition process may be used. Alternatively, a non-doped Si-containing layer can be first applied by deposition and thereafter ion implantation can be used to introduce dopants to the non-doped Si-containing layer. It is observed that the front gate 28A and 28B is of a same or, preferably, a different conductivity type than the back gate 20A and 20B.

The height of front gate 28A and 28B may vary depending on the technique used to form the same as well as the material or materials forming the front gate. Typically, the front gate 28A and 28B has a height from about 75 nm to about 200 nm It is noted that the front gate and the front gate dielectric in both devices regions are patterned into a gate stack utilizing conventional lithography and etching. It is further noted that the source/drain regions as well as the front gate within each of the device regions may be silicided utilizing a conventional silicidation process well known in the art.

The isolation region 16 shown in FIG. 1 is comprised of a conventional trench dielectric material such as, for example, an oxide. The isolation region 16 is formed utilizing standard trench isolation techniques well known in the art.

Figure 2:
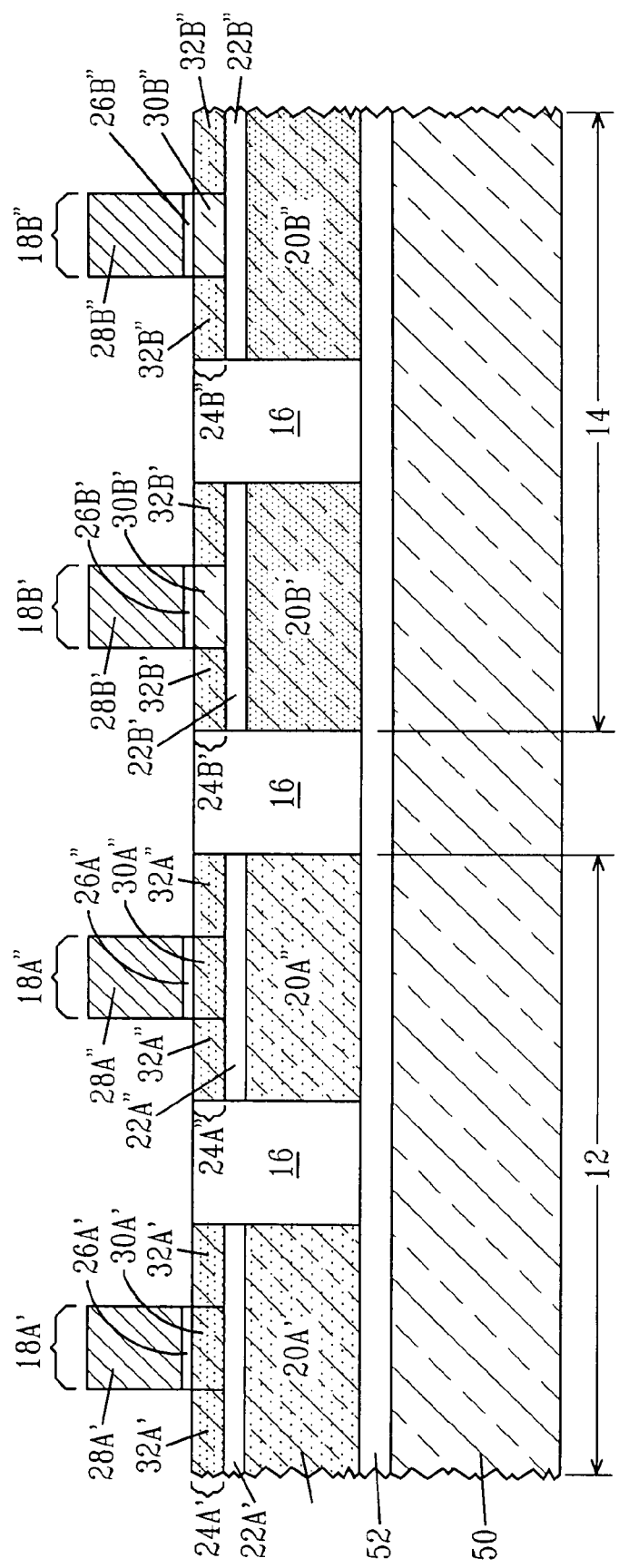
FIG. 2 is a pictorial representation (through a cross sectional view) depicting one embodiment of the inventive structure in which an SOI substrate is used.

FIG. 2 shows one embodiment of the present invention in which the substrate under the back gate region is a fragment of an SOI wafer. In FIG. 2, reference numeral 50 denotes the bottom semiconducting layer of an SOI substrate and reference numeral 52 denotes the buried insulating layer. In this embodiment, both n-type and p-type front gate devices are shown in both the device regions. In the drawings, the 'the single prime' designation is used to describe the nFET devices, while the "double prime" designation is used to describe the pFET devices. Thus, 18A' denotes an nFET logic device, 18A" denotes a pFET logic device, 18B' denotes an nFET SRAM device, and 18B" denotes a pFET SRAM device.

Figure 3:
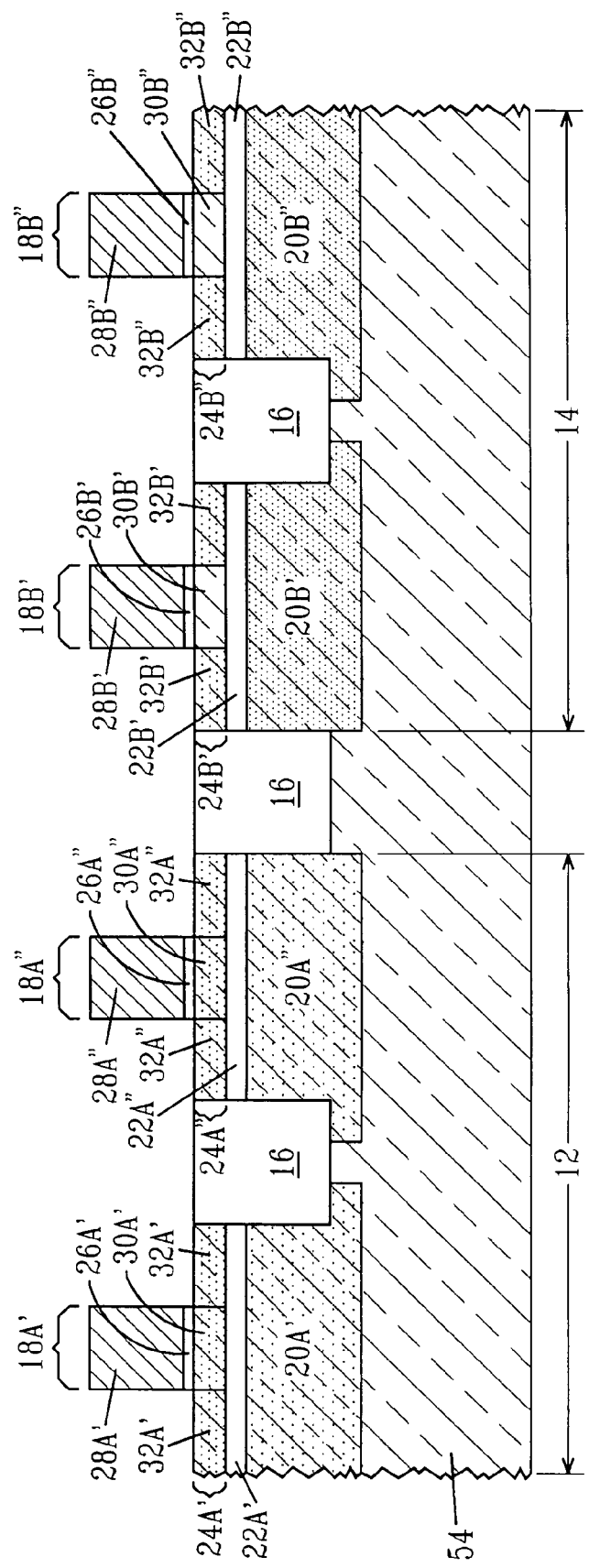
FIG. 3 is a pictorial representation (through a cross sectional view) depicting another embodiment of the inventive structure in which a bulk semiconductor structure is used.

FIG. 3 shows another embodiment of the present invention in which the substrate under the back gate region is a bulk semiconductor 54. The above designations mentioned in regard to FIG. 2 are also used here as well.

It is observed that in FIG. 2, each of the back gate regions is isolated from the bottom semiconducting layer 50 by buried insulating layer 52. This particularly structure permits unrestricted use of the back gate bias during operation since the back gates are perfectly isolated from the substrate as well as from each other.

In regard to FIG. 3, the back gates are essentially deep well implants that are formed with a bulk semiconductor substrate 54. In the case of a p-type substrate, the n+ back gate is separated by a pn junction from the substrate and the p+ back gate. In the case of an n-type substrate, the p+ back gate is separated by a pn junction from the substrate and the n+ back gate. In both cases, the back gate biases will be limited so that the voltage across the pn junction keeps the bias in reverse mode. The level of doping in the back gate can also be used to adjust the front gate threshold in moderate amounts. The trade off with this structure is to balance the impact of additional junction capacitance for the logic gates at the highest back gate doping levels.

In accordance with the present invention, and to maximize back gate control in the SRAM regions (i.e., the regions including an undoped channel), heavily doped back gate electrodes with p+ doping and n+ doping, for nFETs and pFETs, respectively, are provided in these regions, relative to the doping concentration in the logic device areas (i.e., devices including a doped channel). Highly doped back gates will degrade logic device performance due to capacitive coupling of the drain to the back gate. To minimize this additional capacitance, the back gates in the logic regions are only lightly doped and are biased with a voltage which keeps portions under the drain largely depleted. In accordance with the present invention, the back gate is not utilized in the logic regions for threshold control. Short channel control (SCE) can be achieved in the present invention however by employing a conventional halo implant in the logic regions. In the SRAM regions, halo doping is not needed, since the threshold voltage is set by appropriate back gate biasing. This adjustment can be fine tuned for the particular chip to compensate for other systemic variations like gate length or body thickness. Alternatively a reduced net doping in the logic device area can be accomplished by an optimized deep source/drain implant, in the preferred implementation, which is self aligned to the front gate. This would allow additional SCE control for the logic devices by a higher back gate doping directly under the channel.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A semiconductor structure comprising:
    a substrate including at least one logic device region and at least one SRAM device region, said device regions are separated by an isolation region and said substrate is a fragment of a semiconductor-on-insulator comprising a bottom semiconducting layer and a buried insulating layer atop said bottom semiconducting layer;
    at least one double gated logic device within said at least one logic device region, wherein said at least one double gated logic device includes, from bottom to top, a back gate, a back gate dielectric, a body region, a front gate dielectric and a front gate, said body region of said logic device includes a doped channel; and
    at least one double gated SRAM device within said least one SRAM device region, wherein said at least one double gated SRAM device includes, from bottom to top, a back gate having a dopant concentration of about $1 \times 10^{20}$ atoms/cm$^3$ or greater, a back gate dielectric, a body region, a front gate dielectric and a front gate, said body region of said SRAM device includes a non-doped channel and said back gate of said SRAM device has a higher doping level that said back gate of said logic device, and wherein said back gate within said logic device region and said SRAM device region both have an n-type conductivity, said front gate within both said device regions has a p-type conductivity, said doped channel has said n-type conductivity.

* * * * *